United States Patent
Huang et al.

(10) Patent No.: US 10,035,929 B2
(45) Date of Patent: Jul. 31, 2018

(54) PH-ADJUSTER FREE CHEMICAL MECHANICAL PLANARIZATION SLURRY

(71) Applicant: Taiwan Semiconductor Manufacturing Co., Ltd., Hsin-Chu (TW)

(72) Inventors: Shu-Hao Huang, Taichung (TW); Horng-Huei Tseng, HsinChu (TW); Chi-Ming Yang, Hsinchu (TW); Jeng-Jyi Hwang, Chu-Tong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/338,526

(22) Filed: Oct. 31, 2016

(65) Prior Publication Data
US 2017/0152402 A1 Jun. 1, 2017

Related U.S. Application Data

(60) Provisional application No. 62/260,780, filed on Nov. 30, 2015.

(51) Int. Cl.
| | |
|---|---|
| *H01L 21/302* | (2006.01) |
| *C09G 1/04* | (2006.01) |
| *H01L 21/306* | (2006.01) |
| *B24B 37/20* | (2012.01) |
| *H01L 21/321* | (2006.01) |

(52) U.S. Cl.
CPC ............. *C09G 1/04* (2013.01); *B24B 37/20* (2013.01); *H01L 21/30617* (2013.01); *H01L 21/30625* (2013.01); *H01L 21/3212* (2013.01)

(58) Field of Classification Search
CPC ..... C09G 1/00; C09G 1/02; C09G 1/04; C09G 1/06; H01L 21/30625; H01L 21/30617; H01L 21/3212; B24B 37/20
(Continued)

(56) References Cited

U.S. PATENT DOCUMENTS

| | | | | |
|---|---|---|---|---|
| 6,130,163 A | * | 10/2000 | Yi | ........................ B24B 37/0056 156/345.13 |
| 2002/0072238 A1 | * | 6/2002 | Peng | ........................ B24B 7/228 438/692 |

(Continued)

OTHER PUBLICATIONS

Sivanandini, et al. "Chemical Mechanical Polishing by Colloidal Silica Slurry." International Journal of Engineering Research and Applications (IJERA) ISSN: 2248-9622 www.ijera.com vol. 3, Issue 3, May-Jun. 2013, pp. 1337-1345.

(Continued)

*Primary Examiner* — Lan Vinh
(74) *Attorney, Agent, or Firm* — Eschweiler & Potashnik, LLC

(57) ABSTRACT

The present disclosure relates to a method of forming a CMP slurry that is free of pH-adjusters (i.e., chemicals added solely for the purpose of adjusting a pH of a CMP slurry), and an associated a pH-adjuster free CMP slurry. In some embodiments, the method is performed by forming a CMP slurry having a first pH value. A desired pH value of the CMP slurry is determined. A chelating agent configured to bond to metallic ions is provided to the CMP slurry. The chelating agent is configured to adjust a pH value of the CMP slurry from the first pH value to the desired pH value. By using the chelating agent to adjust a pH value of the CMP slurry to achieve a desired pH value, the method is able to form a CMP slurry that is free of pH-adjusters, thereby reducing the cost and complexity of the CMP slurry.

20 Claims, 6 Drawing Sheets

(58) Field of Classification Search
USPC .... 252/79.1, 79.2, 79.3, 79.4; 438/691, 692, 438/693, 694
See application file for complete search history.

(56) References Cited

U.S. PATENT DOCUMENTS

| | | | | |
|---|---|---|---|---|
| 2006/0246724 A1* | 11/2006 | Takamatsu | ........ | H01L 21/02024 438/692 |
| 2007/0004209 A1* | 1/2007 | Feller | ........ | C09G 1/02 438/692 |
| 2008/0166958 A1* | 7/2008 | Golden | ........ | B23H 5/08 451/453 |
| 2009/0291873 A1* | 11/2009 | Tamboli | ........ | C11D 3/2075 510/175 |
| 2010/0167547 A1* | 7/2010 | Kamimura | ........ | C09G 1/02 438/693 |
| 2011/0008965 A1* | 1/2011 | Takemiya | ........ | B24B 37/044 438/693 |
| 2013/0280910 A1* | 10/2013 | Ihnfeldt | ........ | C09K 3/1454 438/693 |
| 2014/0263184 A1* | 9/2014 | Fu | ........ | C09G 1/02 216/89 |

OTHER PUBLICATIONS

The Dow Chemical Company. "Dow Chelating Agents. Effective, economical Metal Ion Control. Versense, Versenex, and Versenol Chelating Agents." Retrived Aug. 12, 2016 from http://msdssearch.dow.com/PublishedLiteratureDOWCOM/dh_003d/0901b8038003db82.pdf?filepath=versene/pdfs/noreg/113-01259.pdf&fromPage=GetDoc.

* cited by examiner

300

302

304

306

308

310

312

314

PH-ADJUSTER FREE CHEMICAL MECHANICAL PLANARIZATION SLURRY

REFERENCE TO RELATED APPLICATION

This Application claims priority to U.S. Provisional Application No. 62/260,780 filed on Nov. 30, 2015, the contents of which is hereby incorporated by reference in its entirety.

BACKGROUND

Integrated chips are constructed using complex fabrication processes that form a plurality of different layers on top of one another. Many of the different layers are patterned using photolithography, a process by which a photosensitive material is selectively exposed to electromagnetic radiation. For example, photolithography may be used to define back-end-of-the-line metallization layers that are formed on top of one another.

To ensure that the different layers are formed with a good structural definition, the electromagnetic radiation must be properly focused. To properly focus electromagnetic radiation, a substrate must be substantially planar to avoid depth of focus problems. Chemical mechanical planarization (CMP) is a widely used process by which both chemical and mechanical forces are used to planarize a semiconductor substrate. The planarization prepares the substrate for the formation of a subsequent layer by providing a planar surface that mitigates depth of focus problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
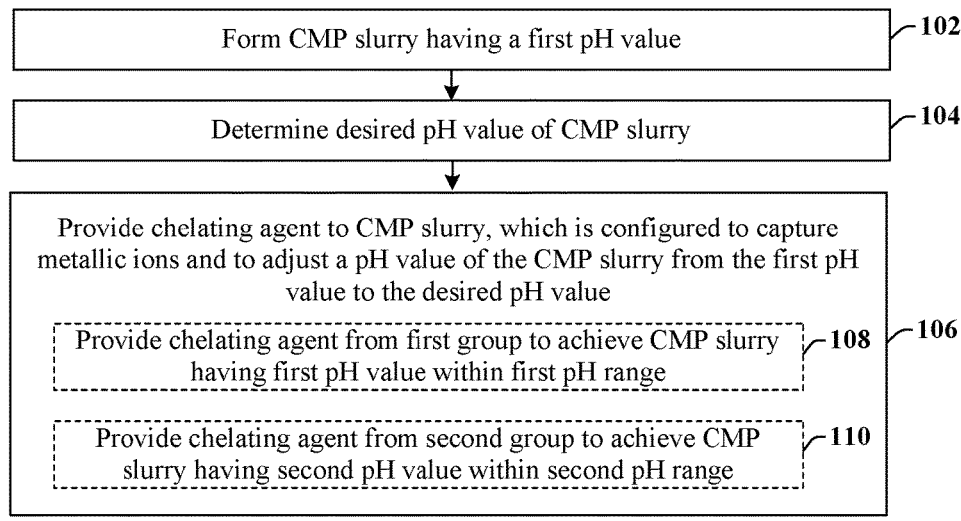
FIG. 1 illustrates a flow diagram of some embodiments of a method of forming a pH-adjuster free chemical mechanical planarization (CMP) slurry composition.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The pH of a liquid is a measure of how acidic or basic the liquid is. In a chemical mechanical planarization (CMP) slurry, pH is an important factor in determining the performance of the CMP slurry. For example, the pH value of a CMP slurry can directly impact the slurry's removal rate of a material during a CMP process. Therefore, CMP slurry's often comprise pH-adjusters. pH-adjusters are chemicals that are added to a CMP slurry to adjust a pH value of the slurry and to thereby achieve a desired performance. For example, a pH-adjuster may be added to a CMP slurry to adjust the pH value of the CMP slurry and thereby increase a removal rate of a material.

While pH-adjusters may be used to improve performance, they increase the cost and complexity of the CMP slurry. Furthermore, it has been appreciated that pH-adjusters may comprise chemicals that can adversely affect a surface being polishing since CMP slurries often interact with metal or semiconductor surfaces that are being polishing. For example, the use of KOH or $H_2SO_4$ as a pH-adjuster can lead to impurities within a silicon substrate, thereby degrading performance of devices formed within the substrate.

The present disclosure relates to a method of forming a CMP slurry that is free of pH-adjusters (i.e., chemicals added solely for the purpose of adjusting a pH of a CMP slurry), and an associated pH-adjuster free CMP slurry. In some embodiments, the method comprises forming a CMP slurry having a first pH value. A desired pH value of the CMP slurry is determined. A chelating agent configured to bond to metallic ions is provided to the CMP slurry. The chelating agent is configured to adjust a pH value of the CMP slurry from the first pH value to the desired pH value. By using the chelating agent to adjust a pH value of the CMP slurry to achieve the desired pH value, the method is able to form a CMP slurry that is free of pH-adjusters, thereby reducing the cost and complexity of the CMP slurry.

FIG. 1 illustrates a flow diagram of some embodiments of a method 100 of forming a pH-adjuster free chemical mechanical planarization (CMP) slurry composition.

At 102, a CMP slurry having a first pH value is formed. In some embodiments, the CMP slurry may comprise a mixture of water (e.g., de-ionized water), chemicals, and/or abrasive particles. In some embodiments, the chemicals may comprise an inhibiting agent, an oxidizing agent, and/or a surfactant.

At 104, a desired pH value of the CMP slurry is determined. The desired pH value of the CMP slurry may be determined based upon a material being planarized and/or a desired rate of removal of a material being planarized.

At 106, a chelating agent is provided to the CMP slurry to adjust a pH value of the CMP slurry from the first pH value to the desired pH value. The chelating agent comprises a molecular compound that is configured to increase a removal rate of a material being polishing by bonding to metallic ions (e.g., metal ions and/or metalloid ions) that may be dislodged from a surface during a CMP process.

In some embodiments, the chelating agent may be selected to have a chemical composition that depends upon the first pH value and the desired pH value. For example, in some embodiments, at 108, the chelating agent may be selected from a first group of chelating agents to achieve a CMP slurry having a first pH value within a first range of pH values (e.g., within a range of between approximately 2 and approximately 5). In other embodiments, at 110, the chelating agent may be selected from a second group of chelating agents to achieve a CMP slurry having a second pH value within a second range of pH values (e.g., within a range of between approximately 9 and approximately 12).

By using the chelating agent to adjust a pH value of the CMP slurry to achieve a desired pH value, the method 100 is able to form a CMP slurry that is free of pH-adjusters (i.e., chemical that having a single purpose of adjusting a pH value of a CMP slurry). The pH-adjuster free CMP slurry is low cost and mitigates chemical interactions that may contaminate metal surfaces and degrade integrated chip performance.

Figure 2:
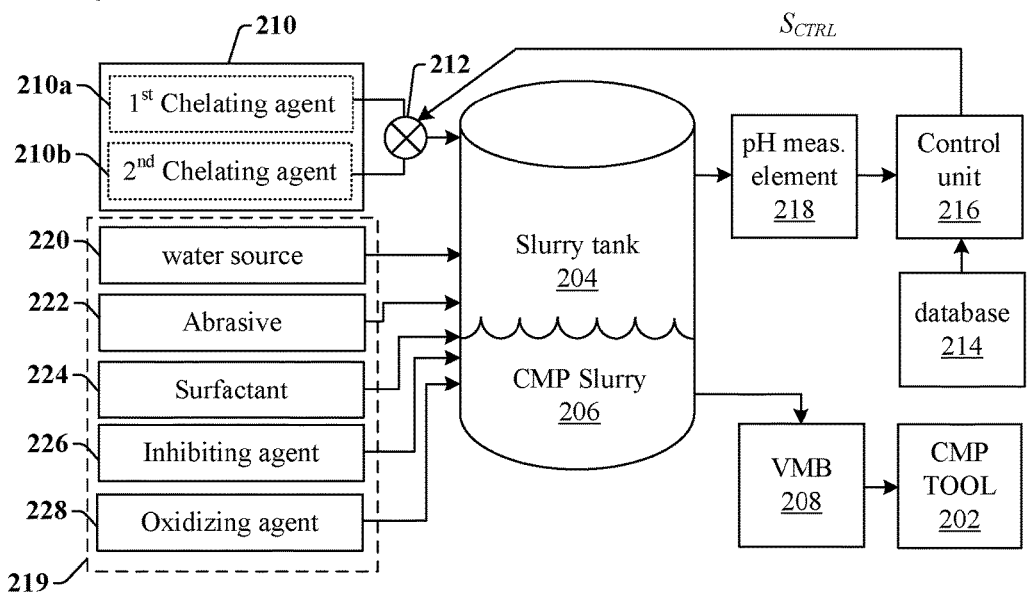
FIG. 2 illustrates a block diagram of some embodiments of a chemical mechanical planarization (CMP) system configured to generate a pH free CMP slurry composition.

FIG. 2 illustrates a block diagram of some embodiments of a chemical mechanical planarization (CMP) system 200 configured to perform a CMP process using a pH-adjuster free CMP slurry composition.

The CMP system 200 comprises a CMP tool 202 configured to perform a chemical mechanical planarization (CMP) process on a substrate (e.g., a semiconductor substrate). The CMP tool 202 is coupled to a CMP slurry tank 204 configured to hold a pH-adjuster free CMP slurry 206. The pH-adjuster free CMP slurry 206 does not comprise a pH-adjuster (i.e., a chemical added solely for the purpose of adjusting a pH of the CMP slurry). The pH-adjuster free CMP slurry 206 comprises a liquid that is used by the CMP tool 202 to perform the CMP process. In some embodiments, the CMP slurry tank 204 may be coupled to the CMP tool 202 by way of a valve manifold box 208 configured to selectively provide the pH-adjuster free CMP slurry 206 to the CMP tool 202 when the CMP tool 202 is operated to perform the CMP process on the substrate.

The CMP slurry tank 204 is coupled to a chelating agent source 210 configured to provide a chelating agent to the CMP slurry tank 204. In some embodiments, the chelating agent source 210 is coupled to the CMP slurry tank 204 by way of a valve 212. The valve is configured to selectively provide a chelating agent from the chelating agent source 210 to the CMP slurry tank 204 depending upon a pH value of the pH-adjuster free CMP slurry 206 and a desired pH value of the pH-adjuster free CMP slurry 206 (e.g., depending upon a difference between the pH value and the desired pH value).

In some embodiments, the chelating agent source 210 may comprise a first chelating agent source 210a comprising a first chelating agent and a second chelating agent source 210b comprising a second chelating agent. In some embodiments, the first chelating agent is configured to provide the pH-adjuster free CMP slurry 206 with a pH value within a first range of pH values (e.g., within a range of pH values between approximately 2 and approximately 5), while the second chelating agent is configured to provide the pH-adjuster free CMP slurry 206 with a pH value within a second range of pH values (e.g., within a range of pH values between approximately 9 and approximately 12).

In some embodiments, a database 214 is configured to store a plurality of desired pH levels for different CMP processes performed by the CMP tool 202. For example, the database 214 may comprise a first desired pH level for a CMP process to planarize a surface comprising a first material (e.g., silicon), a second desired pH level for a CMP process to planarize a surface comprising a second material (e.g., copper), etc. The database 214 may be configured to provide a desired pH level to a control unit 216 that is configured to control operation of the valve 212. Depending upon a desired pH level, the control unit 216 may operate the valve 212 to selectively provide a selected volume of the first chelating agent and/or a selected volume of the second chelating agent to the CMP slurry tank 204. The first or second chelating agent output from the valve 212 is configured to adjust a pH value of the pH-adjuster free CMP slurry 206 to a desired pH value. For example, if the CMP tool 202 is operated to perform a planarization process on a silicon surface, the database 214 may provide a first desired pH level to the control unit 216. In response to the first desired pH level, the control unit 216 will operate the valve 212 to provide a chelating agent to the CMP slurry tank 204, which adjusts a pH level of the pH-adjuster free CMP slurry 206 to the first desired pH level.

In some embodiments, a pH measurement element 218 may be configured to measure a first pH value of the pH-adjuster free CMP slurry 206 within the CMP slurry tank 204. The first pH value may be provided to the control unit 216. Based upon the first pH value and the desired pH value, the control unit 216 may selectively operate the valve 212 to provide a chelating agent to the CMP slurry tank 204 to give the pH-adjuster free CMP slurry 206 the desired pH level. In some embodiments, the control unit 216 may selectively operate the valve 212 to provide a chelating agent having a chemical composition that depends upon the first pH value and the desired pH value. In some additional embodiments, the control unit 216 may selectively operate the valve 212 to provide a volume of a chelating agent that depends upon the first pH value and the desired pH value. For example, a volume of the chelating agent added to the CMP slurry tank 204 may be proportional to a difference between the first pH value and the desired pH value (e.g., a larger difference between the first pH value and the desired pH value means that a larger amount of a chelating agent is to be added to the CMP slurry tank 204 to adjust the value of the pH-adjuster free CMP slurry 206 to the desired pH value).

In some embodiments, the CMP slurry tank 204 may further comprise one or more additional inlets coupled to one or more additional slurry component sources 219 configured to provide one or more additional slurry components to the CMP slurry tank 204 to generate the pH-adjuster free CMP slurry 206. In some embodiments, the one or more additional slurry component sources 219 may be coupled to the CMP slurry tank 204 by way of additional valves (not shown). In some embodiments, the one or more additional slurry component sources 219 may comprise a water source 220 configured to provide water to the CMP slurry tank 204. In some embodiments, the water may comprise de-ionized water, for example.

In some embodiments, the one or more additional slurry component sources 219 may comprise an abrasive source 222 configured to provide abrasive particles to the CMP slurry tank 204. The abrasive particles are used by the CMP tool 202 in mechanical polishing of the substrate. In various embodiments, the abrasive particles may have different sizes or shapes. For example, the abrasive particles may have diameters that are in a range of between approximately 1 nm and approximately 10 nm. In various embodiments, the abrasive particles may comprise colloidal silica, fumed silica, aluminum oxide, and/or silica shell based composite submicron particles.

In some embodiments, the one or more additional slurry component sources 219 may comprise a surfactant source 224 configured to provide a surfactant to the CMP slurry tank 204. The surfactant (e.g., sodium dodecyl sulfate (SDS)) is configured to reduce a number of post-CMP particles on a substrate surface by reducing a surface tension of the pH-adjuster free CMP slurry 206 (and to thereby decrease adhesion forces between the particles and the substrate surface).

In some embodiments, the one or more additional slurry component sources 219 may comprise an inhibiting agent source 226 configured to provide an inhibiting agent to the CMP slurry tank 204. The inhibiting agent is configured to inhibit corrosion of a material of the substrate that is to be planarized. In some embodiments, the inhibiting agent may comprise benzotriazole (BTA) or 1,2,4-triazole, for example.

In some embodiments, the one or more additional slurry component sources 219 may comprise an oxidizing agent source 228 configured to provide an oxidizing agent to the CMP slurry tank 204. The oxidizing agent is configured to oxidize a material of the substrate that is to be planarized, resulting in an oxidized layer that is subsequently removed by a mechanical grinding process. In various embodiments, the oxidizing agent may comprise a compound having one or more oxygen molecule. For example, in some embodiments, the oxidizing agent may comprise one or more of hydrogen peroxide, potassium peroxydisulfate, ammonium peroxydisulfate, sodium peroxydisulfate, potassium peroxymonosulfate, peracetic acid, or tert-butyl hydrogen peroxide.

Figure 3A:
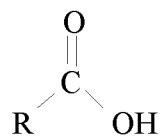
FIGS. 3A-3B illustrates some embodiments of chelating agents configured to control a pH of a CMP slurry composition.
Figure 3A:
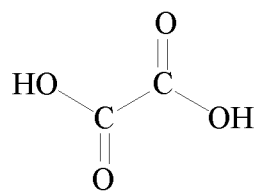
Figure 3A:
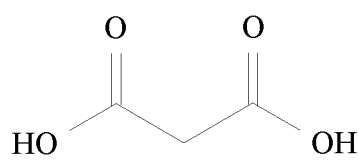
Figure 3A:
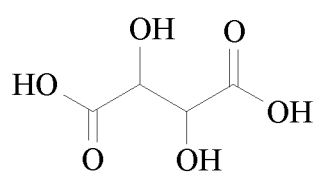
Figure 3B:
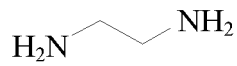
Figure 3B:
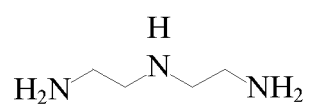
Figure 3B:
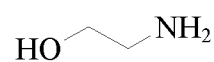
Figure 3B:

FIGS. 3A-3B illustrate some embodiments of chelating agents that are configured to control a pH of a CMP slurry composition. It will be appreciated that the chelating agents shown in FIGS. 3A-3B are non-limiting examples of chelating agents that may be used control a pH of a CMP slurry and that other chelating agents may also be used in other embodiments.

In some embodiments, shown in FIG. 3A, the chelating agent may comprise a carboxylic acid derivative having a carbonyl group (i.e., a carbon atom double-bonded to an oxygen atom: C=O) with an electronegative atom (e.g., oxygen, nitrogen, or a halogen) attached to the carbonyl carbon. The carboxylic acid derivatives are configured to provide for a CMP slurry having an acidic pH value. For example, the chelating agents shown in FIG. 3A may be configured to provide for a CMP slurry having a pH value in a range of between approximately 2 and approximately 5.

As shown in FIG. 3A, in some embodiments the chelating agent may comprise carboxylic acid 300. In other embodiments, the chelating agent may comprise oxalic acid 302. In other embodiments, the chelating agent may comprise malonic acid 304. In yet other embodiments, the chelating agent may comprise tartaric acid 306.

In other embodiments, shown in FIG. 3B, the chelating agent may comprise an amine derivative that is configured to provide for a CMP slurry having a basic pH value. For example, the chelating agents shown in FIG. 3B may be configured to provide for a CMP slurry having a pH value in a range of between approximately 9 and approximately 12.

As shown in FIG. 3B, in some embodiments the chelating agent may comprise ethylene diamine 308. In other embodiments, the chelating agent may comprise oxalic acid diethylene triamine 310. In other embodiments, the chelating agent may comprise ethanol amine 312. In yet other embodiments, the chelating agent may comprise propanol amine 314.

Figure 4:
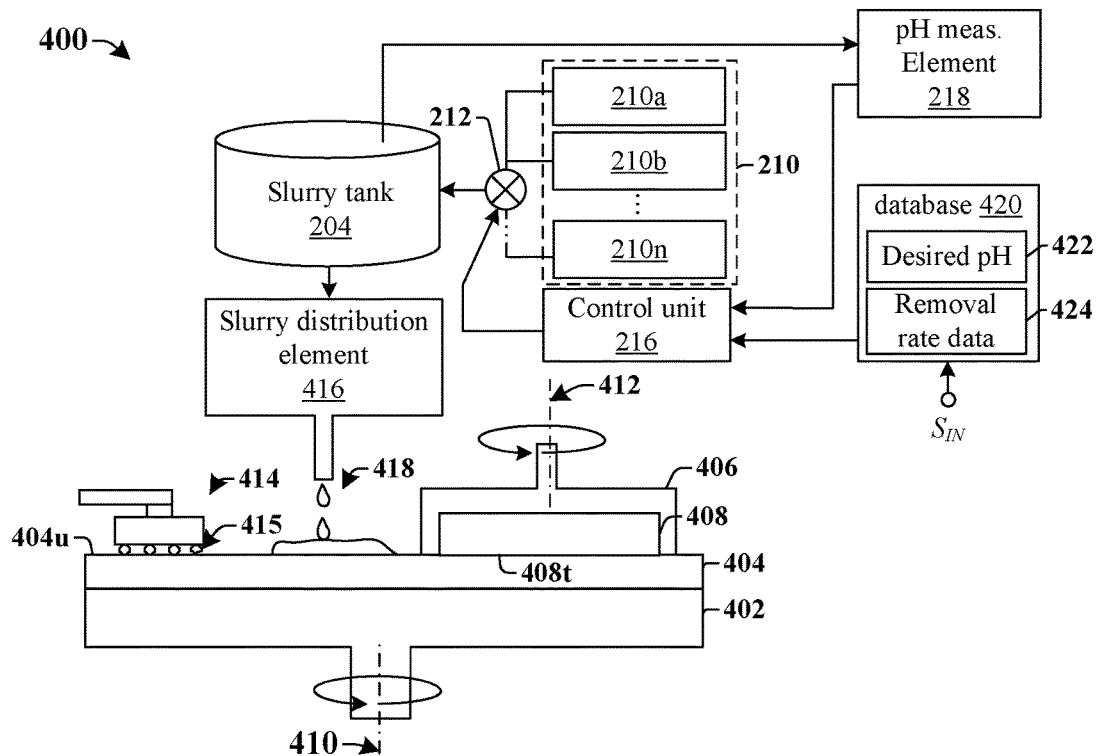
FIG. 4 illustrates some additional embodiments of a block diagram of a CMP system configured to generate a pH-adjuster free CMP slurry composition.

FIG. 4 illustrates some additional embodiments of a block diagram of a chemical mechanical planarization (CMP) system 400 configured to generate a pH-adjuster free CMP slurry composition.

The CMP system 400 comprises a polishing pad 404 located on a platen 402. The polishing pad 404 comprises a rough upper surface 404u configured to perform polishing of a substrate 408. The CMP system 400 further comprises a carrier housing 406 arranged over the polishing pad 404. The carrier housing 406 is configured to house the substrate 408 in an upside down position so that a top surface 408t of the substrate 408 faces the polishing pad 404. In some embodiments, the top surface 408t of the substrate 408 may comprise a metallic element. In some embodiments, the metallic element may comprise a metal (e.g., copper, aluminum, tungsten, etc.) and/or a semiconductor (e.g., silicon, germanium, etc.).

During operation of the CMP system 400, the carrier housing 406 is operable to bring the top surface 408t of the substrate 408 into contact with the rough upper surface 404u of the polishing pad 404. In some embodiments, the platen 402 is configured to rotate the polishing pad 404 about a first axis of rotation 410, while the top surface 408t of the substrate 408 is contacting the rough upper surface 404u of the polishing pad 404 to enable polishing of the top surface 408t. In some additional embodiments, the carrier housing 406 may be configured to rotate the substrate 408 about a second axis of rotation 412 concurrent to rotation of the platen 402.

In some embodiments, a pad conditioning element 414 is arranged over the polishing pad 404. The pad conditioning element 414 comprises a plurality of abrasive elements 415 arranged along a surface of the pad conditioning element 414 that faces the polishing pad 404. The pad conditioning element 414 is configured to push on the upper surface 404u of the polishing pad 404 with a downward force to roughen the upper surface 404u of the polishing pad 404 and provide for improved mechanical polishing. In some embodiments, the plurality of abrasive elements 415 may comprise diamond particles.

A slurry distribution element 416 is configured to deposit a pH-adjuster free CMP slurry 418 onto the upper surface 404u of the polishing pad 404. In some embodiments, the pH-adjuster free CMP slurry 418 does not include a pH-adjuster. In other words, while the a pH-adjuster free CMP slurry 418 comprises a chelating agent that may adjust the pH value of the CMP slurry, the pH-adjuster free CMP slurry 418 does not comprise a chemical that is added solely for the purpose of adjusting a pH of the CMP slurry (i.e., the chelating agent is added for the additional function of increasing a removal rate of a material being polished by bonding to metallic ions that are dislodged from a surface that is polishing). In some embodiments, the pH-adjuster free CMP slurry 418 consists of water (e.g., de-ionized water), a chelating agent, and abrasive particles. In some embodiments, the pH-adjuster free CMP slurry 418 may also consist of one or more of a surfactant, an oxidizer, and an inhibitor.

The slurry distribution element 416 is coupled to a CMP slurry tank 204 configured to store the pH-adjuster free CMP slurry 418. A chelating agent source 210 is also coupled to the CMP slurry tank 204. The chelating agent source 210 is configured to provide a chelating agent to the CMP slurry tank 204. In some embodiments, the chelating agent source 210 may comprise a plurality of chelating agent sources 210a-210n. The plurality of chelating agent sources 210a-210n are respectively configured to output a chelating agent configured to give the pH-adjuster free CMP slurry 418 a selected pH value. For example, the plurality of chelating agent sources 210a-210n may comprise a first chelating agent source 210a configured to output a first chelating agent configured to give the pH-adjuster free CMP slurry 418 a first pH value, and a second chelating agent source 210b configured to output a second chelating agent configured to give the pH-adjuster free CMP slurry 418 a second pH value.

In some embodiments, the plurality of chelating agent sources 210a-210n may be coupled to the CMP slurry tank 204 by way of a valve 212 that is controlled by a control unit 216. In some embodiments, a pH measurement element 218 may be configured to measure a first pH value of the pH-adjuster free CMP slurry 418 within the CMP slurry tank 204. The first pH value may be provided to the control unit 216, which may operate the valve 212 to selectively provide a chelating agent to the CMP slurry tank 204 to adjust a pH value of the pH-adjuster free CMP slurry 418 to achieve a desired pH level.

In some embodiments, the control unit 216 is coupled to a database 420 (e.g., a central processing unit). In some embodiments, the database 420 may be configured to store a plurality of desired pH values 422 respectively corresponding to different CMP processes. For example, the database 420 may comprise a first desired pH value for a CMP process to planarize a surface comprising a first material (e.g., silicon), a second desired pH value for a CMP process to planarize a surface comprising a second material (e.g., copper), etc. Upon receiving an input signal $S_{IN}$, the database 420 is configured to provide a desired pH value to the control unit 216. In some embodiments, the input signal $S_{IN}$ may depend upon a step of a fabrication process being performed (e.g., a metal interconnect planarization step). For example, in some embodiment, the input signal $S_{IN}$ may be entered by a process engineer depending upon a process to be run on a substrate. In other embodiments, the input signal $S_{IN}$ may be dependent upon a bar code marking a substrate carrier (e.g., a FOUP) that is delivered to the CMP system. The bar code tracks the substrates in the substrate carrier, so that a process to be run on the substrates can be determined. Depending upon the desired pH value, the control unit 216 is configured to selectively operate the valve 212 to provide a selected amount of a chelating agent from one of the plurality of chelating agent sources 210a-210n to the CMP slurry tank 204.

In some embodiments, the database 420 may store one or more additional process parameters that indirectly correspond to a desired pH value. For example, in some embodiments, the database 420 may store removal rates 424 of different chelating agents for different material compositions of a substrate to be polished. Because the pH value of a CMP slurry affects the removal rate of the CMP slurry, the different removal rates 424 may correspond to different desired pH values. Therefore, in such embodiments, the selection of a removal rate by the input signal $S_{IN}$ may cause the database 420 to provide a desired pH value to the control unit 216. The desired pH value received by the control unit 216, causes the control unit 216 to operate the valve 212 to provide a chelating agent from one of the plurality of chelating agent sources 210a-210n to the CMP slurry tank 204 depending upon a selected removal rate.

Figure 5:
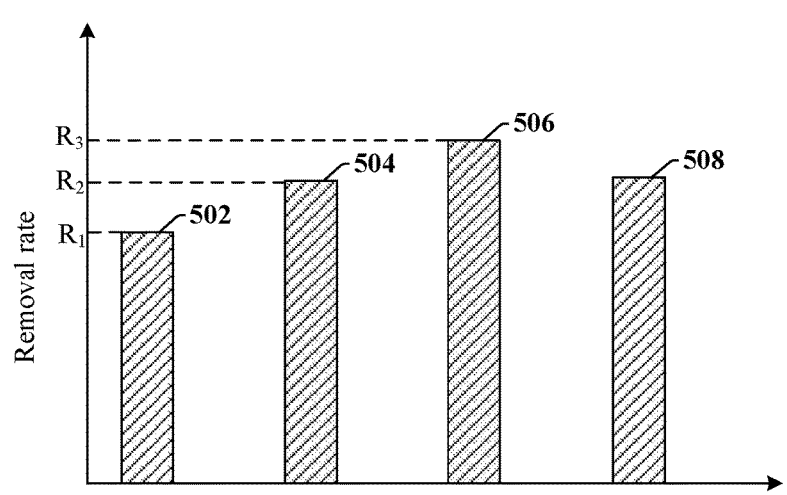
FIG. 5 illustrates a graph showing some exemplary embodiments of a CMP removal rate for different chelating agents configured to provide a CMP slurry with a pH value in a first pH value range.

For example, FIG. 5 illustrates a graph 500 showing some exemplary embodiments of a CMP removal rate of silicon for different chelating agents. As shown in graph 500, the inclusion of a first chelating agent 502 comprising propanol amine to the pH-adjuster free CMP slurry 418 may achieve a desired pH level with a first pH value that results in a first removal rate $R_1$. The inclusion of a second chelating agent 504 comprising ethanol amine to the pH-adjuster free CMP slurry 418 may achieve a desired pH level with a second pH value that results in a second removal rate $R_2$, which is greater than the first removal rate $R_1$. The inclusion of a third chelating agent 506 comprising ethylene diamine to the pH-adjuster free CMP slurry 418 may achieve a desired pH level with a third pH value that results in a third removal rate of $R_3$, which is greater than the second removal rate $R_2$. The inclusion of a fourth chelating agent 508 comprising diethylene triamine to the pH-adjuster free CMP slurry 418 may achieve a desired pH level with a fourth pH value that results in a fourth removal rate, which is substantially equal to the second removal rate $R_2$.

Figure 6:
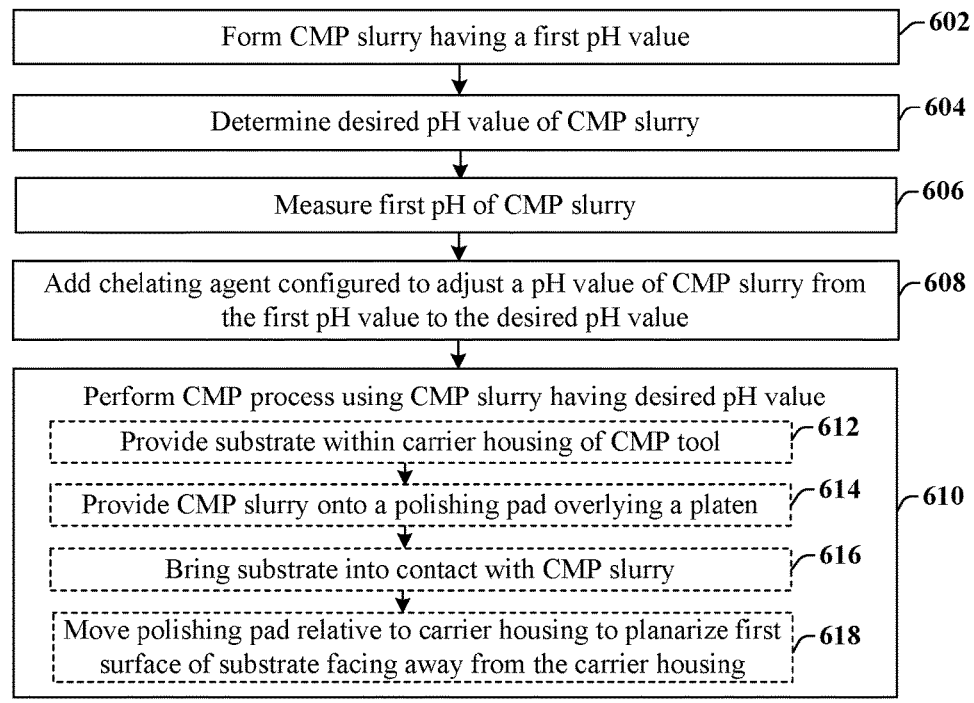
FIG. 6 illustrates a flow diagram of some embodiments of a method of performing a CMP process using a pH-adjuster free CMP slurry.

FIG. 6 illustrates a flow diagram of some embodiments of a method 600 of performing a CMP process using a pH-adjuster free CMP slurry.

While the disclosed methods (e.g., methods 100 and 600) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a CMP slurry is formed.

At 604, a desired pH value of the CMP slurry is determined. In some embodiments, the desired pH value of the CMP slurry may be determined based upon a composition of a surface of a substrate to be planarized. For example, if a silicon surface is to be planarized the desired pH value may have a first pH value, while if a copper surface is to be planarized the desired pH value may have a second value. In some embodiments, the desired pH level may also be indirectly determined based upon a related process parameters (e.g., a desired CMP removal rate of the surface).

At 606, a first pH value of the CMP slurry is measured.

At 608, a chelating agent is added to the CMP slurry to adjust a pH value of the CMP slurry from the first pH value to the desired pH value. In some embodiments, measuring the first pH value of the CMP slurry (act 606) and adding the chelating agent (act 608) may be iteratively performed to incrementally change the pH value of the CMP slurry until the desired pH value is achieved. Because the chelating agent is configured to adjust the pH value of the CMP slurry, the CMP slurry is able to achieve the desired pH value without adding a pH-adjuster to the CMP slurry solely for a purpose of adjusting the pH value of the CMP slurry.

At 610, a CMP process is performed on a substrate using the CMP slurry having the desired pH value. In some embodiments, the CMP process may be performed according to acts 611-618.

At 612, a substrate is provided within a carrier housing of a chemical mechanical planarization (CMP) tool so that a first surface of the substrate facing away from the carrier housing is exposed.

At 614, the CMP slurry having the desired pH value is provided onto a polishing pad overlying a platen of the CMP tool.

At 616, the substrate is brought into contact with CMP slurry. As the substrate is brought into contact with the CMP slurry, oxidizing agents within the CMP slurry may oxidize the first surface of the substrate.

At 618, the polishing pad is moved (i.e., rotated) relative to carrier housing to planarize the first surface of the substrate.

FIGS. 7-10B illustrate some embodiments of a CMP process (e.g., act 610 of method 600) performed using a disclosed pH-adjuster free CMP slurry.

Figure 7:
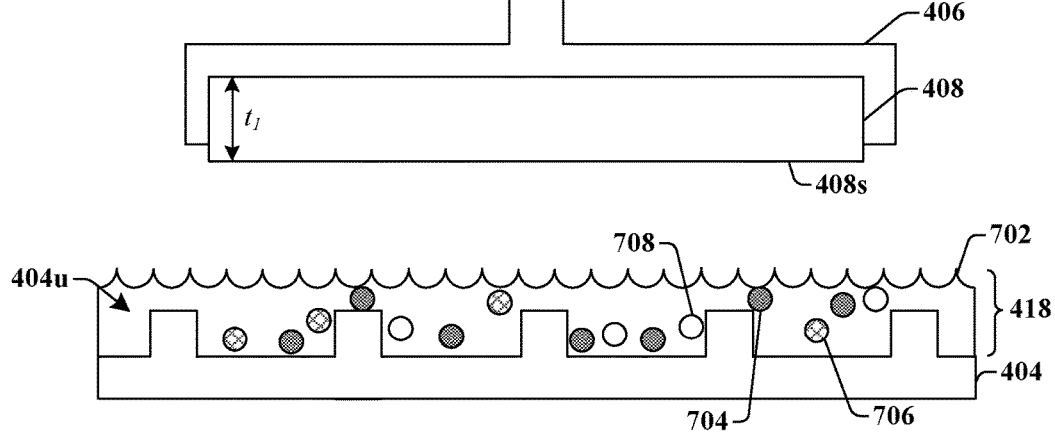
FIGS. 7-10B illustrate some embodiments of a CMP process performed using a disclosed pH-adjuster free CMP slurry

FIG. 7 illustrates a cross-sectional view 700 of a CMP process in which a carrier housing 406 comprising a substrate 408 is brought into contact with a pH-adjuster free CMP slurry 418.

As shown in cross-sectional view 700, a pH-adjuster free CMP slurry 418 is provided onto a polishing pad 404. The polishing pad 404 has a rough upper surface 404u facing the pH-adjuster free CMP slurry 418. A substrate 408 is also provided into a carrier housing 406, such that a first surface 408s of the substrate 408 is exposed. The substrate 408 may comprise any type of semiconductor body (e.g., silicon, SiGe, SOI, etc.) such as a semiconductor wafer as well as any other type of metal layer, device, semiconductor and/or epitaxial layers, etc., associated therewith. In some embodiments, the first surface 408s of the substrate 408 may have a metallic element (e.g., a metal and/or a semiconductor). The substrate 408 may have a first thickness $t_1$.

In some embodiments, the pH-adjuster free CMP slurry 418 comprises water 702, abrasive particles 704, an oxidizing agent 706, and a chelating agent 708. In some embodiments, the pH-adjuster free CMP slurry 418 may further comprise additional components, such as a corrosion inhibitor (not shown) and/or a surfactant (not shown). In other embodiments, the pH-adjuster free CMP slurry 418 may comprise less components (e.g., pH-adjuster free CMP slurry 418 may be devoid of abrasive particles).

Figure 8:
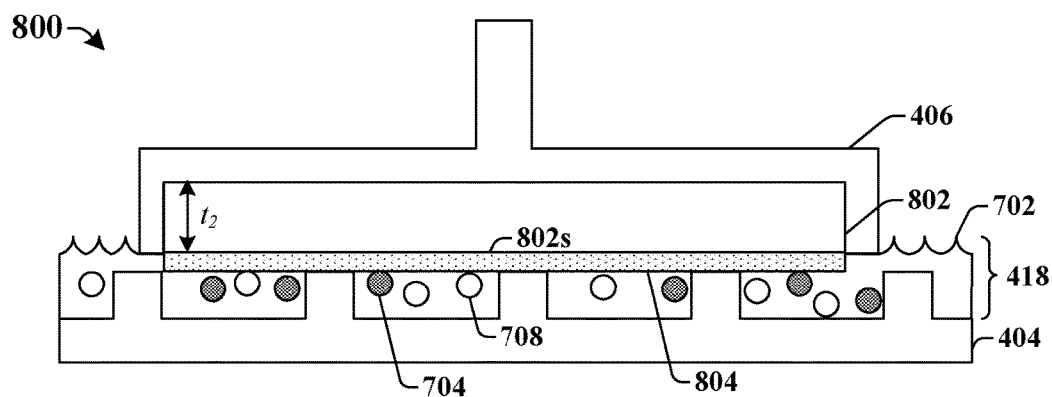

FIG. 8 illustrates a cross-sectional view 800 of a CMP process in which a substrate 802 is oxidized by the oxidizing agent 706 within the pH-adjuster free CMP slurry 418.

As shown in cross-section view 800, the first surface 408s of the substrate 408 is brought into contact with a pH-adjuster free CMP slurry 418 and/or the polishing pad 404. The oxidizing agent 706 within the pH-adjuster free CMP slurry 418 chemically interacts with the substrate 802 to form a metal-oxide layer 804 along the first surface 802s of the substrate 802. The metal-oxide layer 804 is softer than the substrate 802 and therefore enables subsequent removal by way of a mechanical scraping process. The metal-oxide layer 804 consumes a part of the substrate 802, so that a thickness of the substrate 802 is reduced from the first thickness $t_1$ to a second thickness $t_2$, which is less than the first thickness $t_1$. In some embodiments, the substrate 802 may comprise silicon and the metal-oxide layer 804 may comprise a silicon oxide layer. In other embodiments, the substrate 802 may comprise copper and the metal-oxide layer 804 may comprise copper oxide.

Figure 9:
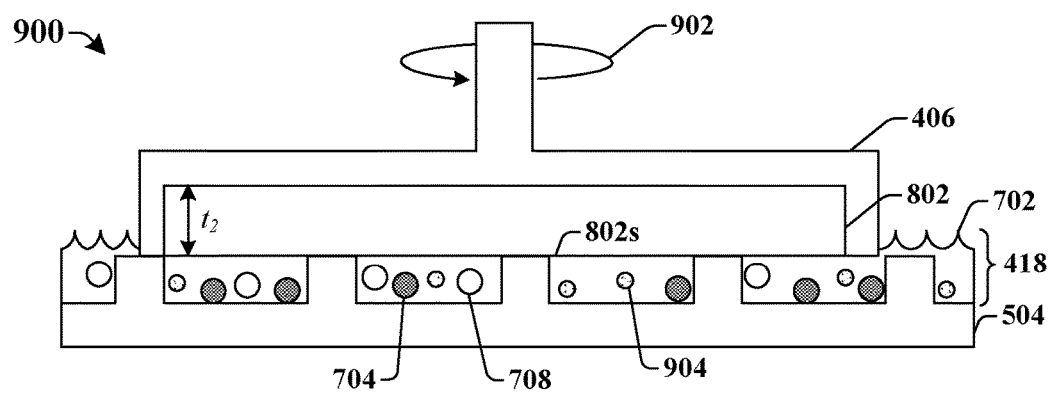

FIG. 9 illustrates a cross-sectional view 900 of a CMP process in which the metal-oxide layer (804 of FIG. 8) is removed from the first surface 802s of the substrate 802. As shown in cross-sectional view 900, the substrate 802 is moved relative to the polishing pad 404 resulting in mechanical polishing/scraping of the metal-oxide layer (804 of FIG. 8) by the polishing pad 404 and/or the abrasive particles 704 within the pH-adjuster free CMP slurry 418. The mechanical polishing/scraping of the metal-oxide layer results in metallic ions 904 within the pH-adjuster free CMP slurry 418. In some embodiments, the metallic ions 904 may comprise copper ions and/or silicon ions. In some embodiments, the substrate 802 is moved relative to the polishing pad 404 by rotating the carrier housing 406 (shown as 902) and/or rotating the polishing pad 404 (not shown).

Figure 10A:
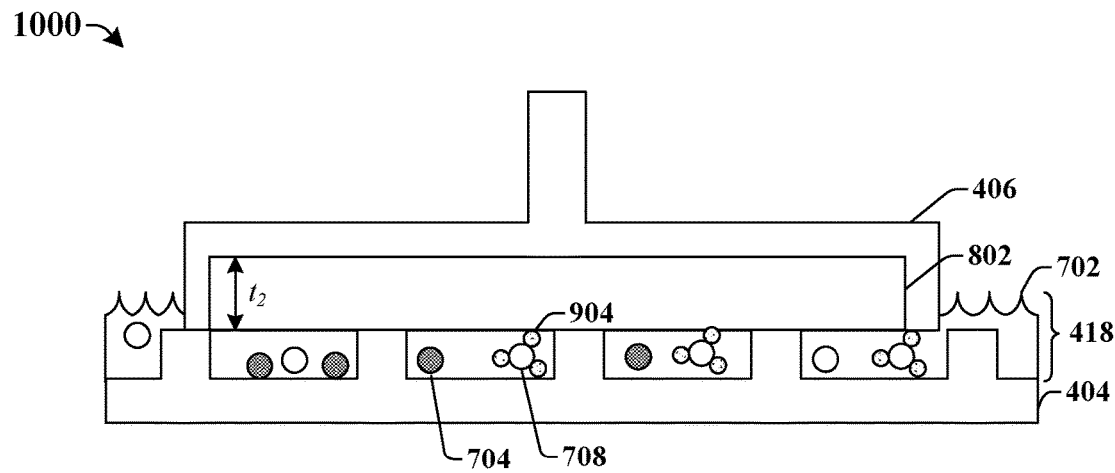

FIG. 10A illustrates a cross-sectional view 1000 of a CMP process in which the metallic ions 902 are captured by the chelating agent 708.

As shown in cross-sectional view 1000, the metallic ions 904 are bonded to open bonds of the chelating agent 708 so that the metallic ions 904 are removed from the first surface 802s of the substrate 802. Removing the metallic ions 904 from the first surface 802s of the substrate 802 keeps the removed metallic ions 904 in a soluble form that therefore increases a removal rate of the metal oxide layer of the substrate 802.

Figure 10B:
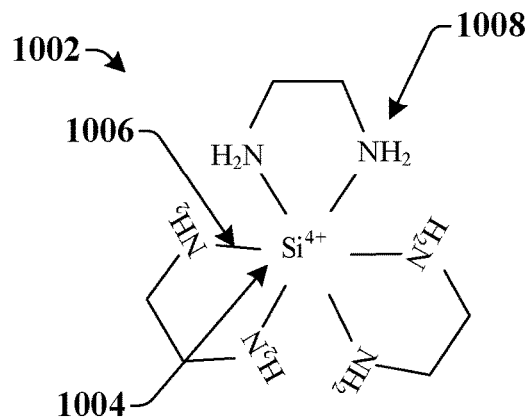

FIG. 10B illustrates a schematic diagram 1002 of an example of some embodiments of a chelating agent comprising ethylene diamine. As shown in schematic diagram 1002, a metallic ion 1004 comprising $Si^{4+}$ is bonded to open bonds 1006 of a chelating agent 1008 comprising the ethylene diamine. By having open bonds 1006 that bond to the metallic ions 1004 comprising $Si^{4+}$, the chelating agent 1008 is able to capture the metallic ions 1004 that are removed from a surface of a substrate during a CMP process, thereby removing the metallic ions 1004 from the surface of the substrate and improving the removal rate of the CMP process.

Therefore, the present disclosure relates to a pH-adjuster free CMP slurry and a method of forming a chemical mechanical planarization (CMP) solution that is free of pH-adjusters (i.e., chemicals added solely for the purpose of adjusting a pH value of a CMP slurry).

In some embodiments, the present disclosure relates to a method of performing a chemical mechanical planarization (CMP) process. The method comprises forming a CMP slurry having a first pH value, and determining a desired pH value of the CMP slurry. The method further comprises providing a chelating agent to the CMP slurry. The chelating agent is configured to bond to metallic ions and to adjust a pH value of the CMP slurry from the first pH value to the desired pH value.

In other embodiments, the present disclosure relates a method of performing a chemical mechanical planarization (CMP) process. The method comprises forming a CMP slurry having a first pH value, and determining a desired pH value of the CMP slurry. The method further comprises measuring the first pH value of the CMP slurry. The method further comprises adding a chelating agent to the CMP slurry to change a pH value of the CMP slurry from the first pH value to the desired pH value. The chelating agent is selected to have a chemical composition that depends upon the first pH value and the desired pH value. The method further comprises providing the CMP slurry having the desired pH value to a CMP tool configured to perform a CMP process on a substrate.

In yet other embodiments, the present disclosure relates to a chemical mechanical polishing (CMP) system. The system comprises a CMP slurry tank configured to store a CMP slurry. The system further comprises a pH measurement element configured to measure a pH value of the CMP slurry. The system further comprises a control unit configured to operate a valve to selectively provide a chelating agent from a chelating agent source to the CMP slurry tank depending on a difference between the pH value and a desired pH value. The chelating agent is configured to bond to metallic ions and to adjust the pH value of the CMP slurry to achieve the desired pH value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of performing a chemical mechanical planarization (CMP) process, comprising:
   forming a CMP slurry having a first pH value;
   determining a desired pH value of the CMP slurry, wherein the desired pH value is determined based upon a composition of a surface of a substrate to be planarized;
   measuring the first pH value of the CMP slurry;
   providing a plurality of chelating agents to the CMP slurry, wherein the chelating agents are configured to bond to metallic ions and to adjust a pH value of the CMP slurry from the first pH value to the desired pH value;
   wherein the chelating agents are selected to have a chemical composition that depends upon the first pH value and the desired pH value; and
   wherein at least one of the chelating agents is selected from a basic group consisting of ethylene diamine, diethylene triamine, ethanol amine, and propanol amine.

2. The method of claim 1, further comprising:
   providing the chelating agents to the CMP slurry from a first group of chelating agents that respectively cause the desired pH value of the CMP slurry to be within a first range of pH values between approximately 2 and approximately 5; or
   providing the chelating agents to the CMP slurry from a second group of chelating agents that respectively cause the desired pH value of the CMP slurry to be within a second range of pH values between approximately 9 and approximately 12.

3. The method of claim 1, wherein the chelating agents comprise an amine derivative configured to adjust the pH value of the CMP slurry from the first pH value to the desired pH value in a range of between approximately 9 and approximately 12.

4. The method of claim 1, further comprising:
   measuring the first pH value of the CMP slurry; and
   adding a selected volume of the chelating agents to the CMP slurry, wherein the selected volume of the chelating agents depends upon the first pH value and the desired pH value.

5. The method of claim 1, further comprising:
   providing the CMP slurry having the desired pH value onto a polishing pad overlying a platen;
   providing the substrate into a carrier housing;
   bringing an upper surface of the substrate into contact with the polishing pad; and
   moving the polishing pad relative to carrier housing to planarize the upper surface of the substrate.

6. The method of claim 1, further comprising:
   not adding potassium hydroxide or sulfuric acid to the CMP slurry.

7. The method of claim 1, further comprising:
   wherein the plurality of chelating agents is selected to have a first chemical composition if the desired pH value is within a first range; and
   wherein the plurality of chelating agents is selected to have a second chemical composition that is different than the first chemical composition if the desired pH value is within a second range different than the first range.

8. The method of claim 1, wherein the chelating agents comprise a carboxylic acid derivative configured to adjust the pH value of the CMP slurry from the first pH value to the desired pH value in a range of between approximately 2 and approximately 5.

9. The method of claim 8, wherein the carboxylic acid derivative comprises one or more of a carboxylic acid, an oxalic acid, a malonic acid, or a tartaric acid.

10. The method of claim 8, wherein the plurality of chelating agents may comprise the carboxylic acid derivative having a carbonyl group with an electronegative atom attached to the carbonyl carbon.

11. A method of performing a chemical mechanical planarization (CMP) process, comprising:
    forming a CMP slurry having a first pH value;
    determining a desired pH value of the CMP slurry;
    measuring the first pH value of the CMP slurry;
    adding one or more chelating agents to the CMP slurry to change a pH value of the CMP slurry from the first pH value to the desired pH value, wherein the one or more chelating agents comprise an amine derivative configured to adjust the pH value of the CMP slurry from the first pH value to the desired pH value in a range of between approximately 9 and approximately 12, and wherein the chelating agents are selected to have a chemical composition that depends upon the first pH value and the desired pH value, and wherein at least one of the chelating agents is selected from a group of pH-basic chemicals consisting of ethylene diamine, diethylene triamine, ethanol amine, and propanol amine; and
    providing the CMP slurry having the desired pH value to a CMP tool configured to perform a CMP process on a substrate.

12. The method of claim 1, wherein the one or more chelating agents is further configured to bond to a metallic ion by forming one or more bonds to the metallic ion.

13. The method of claim 11, further comprising:
    adding a selected volume of the one or more chelating agents to the CMP slurry, wherein the selected volume of the one or more chelating agents depends upon the first pH value and the desired pH value.

14. The method of claim 11, wherein the chemical composition of the one or more chelating agents is selected depending upon a desired removal rate of the CMP slurry.

15. The method of claim 11, further comprising:
iteratively measuring the first pH value of the CMP slurry and adding the one or more chelating agents to incrementally change the pH value of the CMP slurry until the desired pH value is achieved.

16. The method of claim 1, further comprising:
adding one of either a carboxylic acid derivative or an amine derivative to the CMP slurry depending upon the desired pH value.

17. A chemical mechanical polishing (CMP) system, comprising:
a CMP slurry tank configured to store a CMP slurry;
a pH measurement element configured to measure a pH value of the CMP slurry;
a control unit configured to operate a valve to selectively provide a first chelating agent having a first chemical composition from a first chelating agent source to the CMP slurry tank when a desired pH value is within a first range, and to selectively provide a second chelating agent having a second chemical composition that is different than the first chemical composition from a second chelating agent source when the desired pH value is within a second range different than the first range;
wherein the chelating agent is configured to bond to metallic ions and to adjust the pH value of the CMP slurry to achieve the desired pH value; and
wherein the control unit is configured to selectively operate the valve depending upon the desired pH value to:
provide the first chelating agent from a first group of chelating agents that respectively cause the desired pH value of the CMP slurry to be within a first range of pH values between approximately 2 and approximately 5; or
provide the second chelating agent from a second group of chelating agents that respectively cause the desired pH value of the CMP slurry to be within a second range of pH values between approximately 9 and approximately 12.

18. The system of claim 17, further comprising:
a database configured to store a plurality of desired pH values; and
a CMP tool configured to perform a CMP process on a surface of a substrate, wherein the database is configured to select one of the plurality of desired pH values to be the desired pH value based upon a material composition of the surface of the substrate.

19. The system of claim 17, wherein the second chelating agent is selected from the second group of chelating agents consisting of ethylene diamine, diethylene triamine, ethanol amine, and propanol amine.

20. The system of claim 17, wherein the control unit is configured to selectively operate the valve to add one of either a carboxylic acid derivative or an amine derivative to the CMP slurry depending upon the desired pH value.

* * * * *